US006430662B1

(12) United States Patent
Hurich et al.

(10) Patent No.: US 6,430,662 B1
(45) Date of Patent: Aug. 6, 2002

(54) METHOD AND DEVICE FOR CHANGING MEMORY CONTENTS IN A CONTROL UNIT, ESPECIALLY OF A MOTOR VEHICLE

(75) Inventors: Martin Hurich, Vaihingen; Gerald Holzapfel, Marbach, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/383,309

(22) Filed: Feb. 14, 2000

(30) Foreign Application Priority Data

Sep. 1, 1998 (DE) ......................................... 198 39 680

(51) Int. Cl.[7] .............................................. G06F 12/16
(52) U.S. Cl. ....................................................... 711/162
(58) Field of Search ................................ 711/103, 161, 711/162

(56) References Cited

U.S. PATENT DOCUMENTS

| | | | | | |
|---|---|---|---|---|---|
| 5,630,139 | A | * | 5/1997 | Ozaki | 395/712 |
| 5,717,887 | A | * | 2/1998 | Leslie | 395/439 |
| 6,009,500 | A | * | 12/1999 | Rossi | 711/162 |
| 6,009,520 | A | * | 12/1999 | Gharda | 713/1 |
| 6,205,526 | B1 | * | 3/2001 | Tanuma | 711/162 |

FOREIGN PATENT DOCUMENTS

| | | |
|---|---|---|
| DE | 43 32 499 A1 | 3/1995 |
| DE | 0 715 313 A2 | 6/1996 |
| EP | 0 664 387 B1 | 10/1997 |

* cited by examiner

*Primary Examiner*—Kevin L. Ellis
(74) *Attorney, Agent, or Firm*—Michael J. Striker (57) ABSTRACT

A method for changing and/or inputting data and programs into at least one first memory (104) of a computer system, especially for control of operations in a motor vehicle, is described. This method is particularly useful for changing or reprogramming a control unit (100) of a motor vehicle. The programs are divided into at least one first routine and at least one second routine. At least one second memory (105) is provided in addition to the first memory, in which a definite division into certain memory regions is provided. The routines and/or data are backed up in the memory regions. Back up copies of the routines and/or data are provided in at least one of the at least two memories prior to the erasing and/or copying and/or reading in of the data and/or routines in the memory regions. These back up copies are either erased or used again as the original after successful programming, but must not remain stored as backup copies or must be input again from the outside.

18 Claims, 7 Drawing Sheets

FIG. 7

METHOD AND DEVICE FOR CHANGING MEMORY CONTENTS IN A CONTROL UNIT, ESPECIALLY OF A MOTOR VEHICLE

BACKGROUND OF THE INVENTION

1. Field of the Invention

The present invention relates to a method and device for changing and/or for writing in or reprogramming data and/or programs in at least one memory of a computer system, especially in a memory of a control unit for control of operations in a motor vehicle.

2. Prior Art

A method for changing operation of a control unit of a motor vehicle is known from European Patent Document EP 0 664 387 B1. In order to change the resident program in the control unit program information is read out and stored. This program information is stored as a program reference information. The memory region used for this program and program information is then erased and subsequently reprogrammed. The stored program reference information is written in as new program information and subsequently the new program is loaded. A power supply fluctuation or a power supply failure cannot lead to a loss of information because of the generation of program reference information. Regions to be backed up must be written from outside the control unit by means of a second control unit or programming device. Similarly backup copies must be permanently stored, since they will be required in case of a power supply fluctuation or failure so that the programming process can be repeated.

In addition a method for complete reprogramming of an electronically erasable, non-volatile memory in a control unit, particularly for a motor vehicle, is disclosed in German Patent Application DE 43 32 499 A1. The programming process operates without the use of a no longer changeable ROM. The erasable non-volatile memory is divided into at least two separately erasable, non-volatile memory sections, in each of which a program module is written. Because of the division into two separate sections it is possible to completely repeat this programming process in the event of a voltage failure prior to completion of the programming process between the data terminal and the motor vehicle, since the program module is quasi-doubled in the programmable non-volatile memory, and is present also in each separate memory section. Thus if one of these memory sections is erased an intact separate program module is present in the other section. A complete reprogramming only is disclosed in this patent document, but two-part programming is not disclosed and a suggestion of additional program parts and/or routines without erasing the original programs or program routines is not present. Thus copies must be stored for security or reliability reasons, since an interruption, e.g. due to a supply voltage failure, requires a complete reprogramming. This reprogramming also does not run automatically, but must be predetermined and/or controlled from outside of the control unit.

Various methods are known to detect data errors, for example due to erroneous memory or programming steps. Moreover the data and/or programs must be prepared in an error code or error detection code in which redundant information for error detection is included as well as the actual data or program information. Such information includes for example parity bits which allow error detection by check sum formation, such as cross-sums and/or longitudinal sum formation (even parity check). Additional linear and/or cyclic testing methods with Hamming Code, BCH Code (Bose, Chandhuri, Hocquenghem) and Abramson Code are known. The cyclic redundancy check (CRC), in which block-wise test bytes are produced just according to the CRC test process from the data and/or programs, also from the information entities to be read in and/or copied and/or erased, should be included in these testing methods. In a few of these methods error correction occurs as well as error detection, which however relates only to the respective individual detected error. Since the respective test signals are generated according to certain predetermined rules, errors, which do not fit these predetermined rules, are not detected. Because of this error detection and subsequent correction are not completely guaranteed by these methods. On the other hand, the probability that an undetectable error occurs is very slight, but not all errors are detected and thus not all errors can be corrected. Moreover larger data and program sections may be lost, for example because of a voltage interruption occurs during a programming process, of course an error detection without error correction can be performed, since the correction may only take place for individual errors in this testing process.

It has been shown that the above-described method may not provide optimum results in all respects. Thus region of the memory worthy of protection or the entire memory contents must be completely rewritten from outside of the control unit in case of some error. No automatic reduplication of the uncompleted region of the memory due to the interference or interruption; also this requires that a complete programming be performed from outside of the control unit. Because of that copies of data and programs are deposited in the above-described process for security and reliability purposes. Occurring errors that are undetected by the methods for error testing then are not corrected, even if another error is detected in the concerned memory region. Correction of the entire memory region is not performed without a complete reprogramming.

SUMMARY OF THE INVENTION

It is an object of the present invention to provide a method for changing the memory contents of a control unit, which on the one hand performs reliably, i.e. is robust, in the presence of any type or interruption or interference at an arbitrary point in time and, on the other hand, with which a predetermined initial situation can be automatically reproduced.

This object is attained, in part, when a program core or basic program section is used which is stored in memory in such a manner that it is unchangeable, whereby an arbitrary start of the programming method according to choice and a performance of the method according to the invention is automatically guaranteed and performable.

Furthermore the possibility of incomplete error correction should be eliminated in the case of the undetectable errors present, even though the probability of those errors is very slight. This object is attained when the entire memory section or region in which errors are detected is automatically reconstructed so that the undetected errors are corrected at the same time.

Besides this advantage the method according to the invention as claimed in the claims appended hereinbelow has additional advantages.

A subsequent completion of the original data and/or program is always possible using at least one first routine and at least one second or additional routine. This is guaranteed by a definite division of the memory regions whereby it is possible to produce a reliable copy in a memory region or section other than the original region or section prior to erasing and/or copying and/or reading in data and/or the programs or program routines from it within the computer system.

The method according to the invention is designed so that additional program routines (added routines) and/or data which can be backed up or restorable memory regions are automatically restored or backed up in the case of error and/or rewritten and/or the originally started operation is restarted or reinitialized.

Besides the backed up copy of the data and/or program routines which can be backed up can be rewritten after the erasure of the original data or the backup copy and, in the case of the routines controlling the programming, can be erased when the programming process is successfully performed, wherein it need not be stored permanently in both cases. The backup region for the data and/or programs or routines can normally contain other data and/or programs or routines which cannot be backed up and is erased for the purpose of backing-up. Because of that a larger sized memory is not necessary or additional memory locations are freed.

The first and second routines can be processed separately and/or together optionally. In the case of programming a control device for a vehicle by the control device manufacturer this means that, when i.e. additional routines, e.g. customer-specific programs or routines, are used as second routines, also programs of the vehicle manufacturer, processing can be supported in a programming process which is matches the special individual customer requirements to the vehicle type, locations of use and conditions. Furthermore the additional routines can be brought in at any arbitrary time.

Thus the robust method of the invention provides an automatic reproduction of a predetermined starting state of a memory region or section without external intervention without increasing the memory requirement, which permits a very flexible adjustable programming.

The terms "program", "program routine" and "routine" have the same meaning for the purposes of the present application.

BRIEF DESCRIPTION OF THE DRAWINGS

The objects, features and advantages of the invention will now be illustrated in more detail with the aid of the following description of the preferred embodiments, with reference to the accompanying figures in which.

DESCRIPTION OF THE PREFERRED EMBODIMENTS

Figure 1:
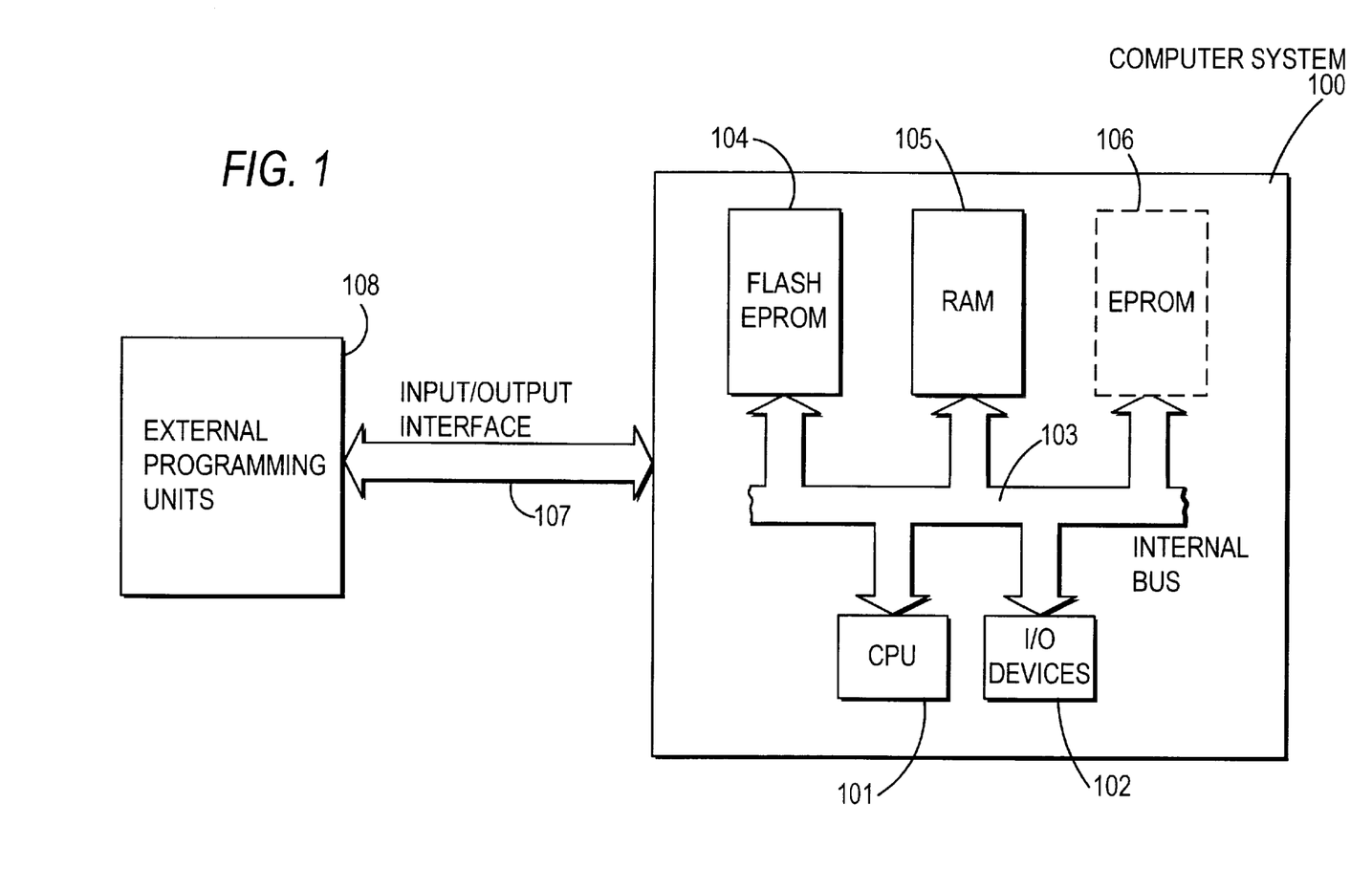
FIG. 1 is a block diagram of one hardware arrangement usable according to the invention.

In FIG. 1 an exemplary hardware arrangement for changing a preset process is illustrated. The hardware arrangement includes a computer system, especially a control unit or control device, including different memories 104, 105 and optionally memory 106. These memories include an erasable, non-volatile memory 104, for example a Flash EPROM memory, in which block-wise erasure and programming of the memory contents are possible. Furthermore the hardware arrangement includes a volatile memory 105, e.g. in the form of a RAM which acts as a second memory for intermediate storage of data and/or programs. Besides program routines can be started from RAM 105. An optional non-volatile memory e.g. in the form of an EPROM can be provided. In order to obtain special reliability this memory 106 can be formed as a non-volatile and unchangeable memory, for example as a ROM. These memories 104,105 and the optional memory 106 are connected by means of a system-internal bus system 103 with a CPU 101 and an input/output device 102. Besides that the computer system, especially a control unit, can contain additional unshown components, e.g. additional CPUs and memories, different input/output devices. The computer system 100 is connected with an external controlling or programming unit 108 that can be a conventional computer and which inputs data and/or programs, for example for programming a new version of a program and/or data. Besides that other input media that could be directly connected to the additional input/output devices are conceivable at these locations.

Figure 2:
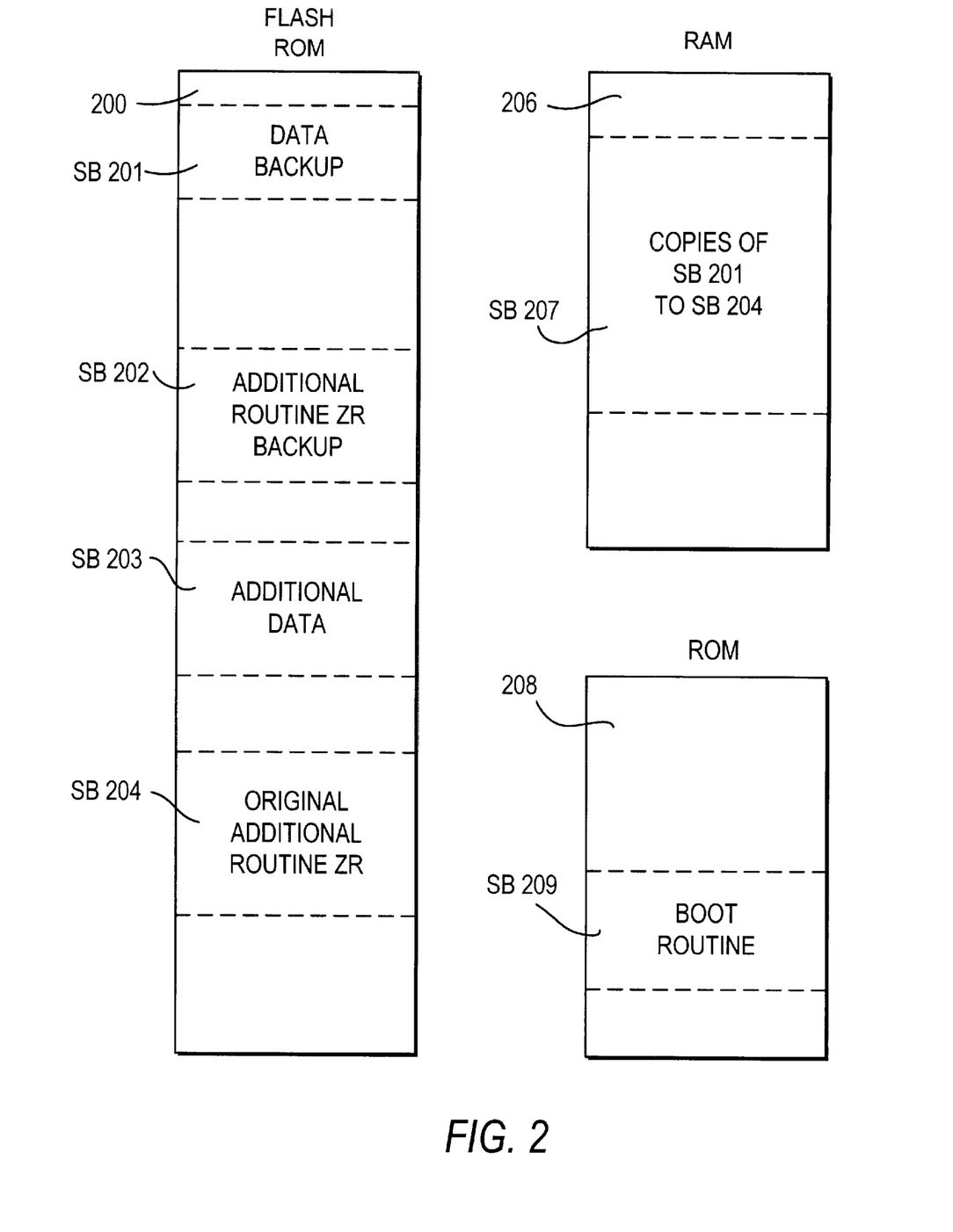
FIG. 2 is a diagrammatic view showing a first embodiment of a division of memory into flash, RAM and ROM memories.

The division of the memory into memory regions in a first embodiment in which the ROM 106 is used is shown in FIG. 2. The entire flash EPROM memory 104 is indicated with 200 symbolically. It contains, among other things, a memory region SB 201, which represents a backup region for data. Besides that a memory region SB 202 is provided, which represents the backup region for the second program routine or additional routines ZR. The memory region SB 203 corresponds to the original region for the data. The original memory region for the additional routines is indicated SB 204. The RAM memory is indicated symbolically with block 206. In that block 206 a memory region SB 207 is located, which receives the copies of the flash memory regions SB 201 to SB 204 according to a first embodiment of the method according to the invention. The ROM 106 is indicated symbolically by the block 208. The region SB 209 of this latter block contains the boot block or the routine for starting the system and the method and/or the first program. This program routine is indicated in ROM with routines in ROM RR.

Figure 3:
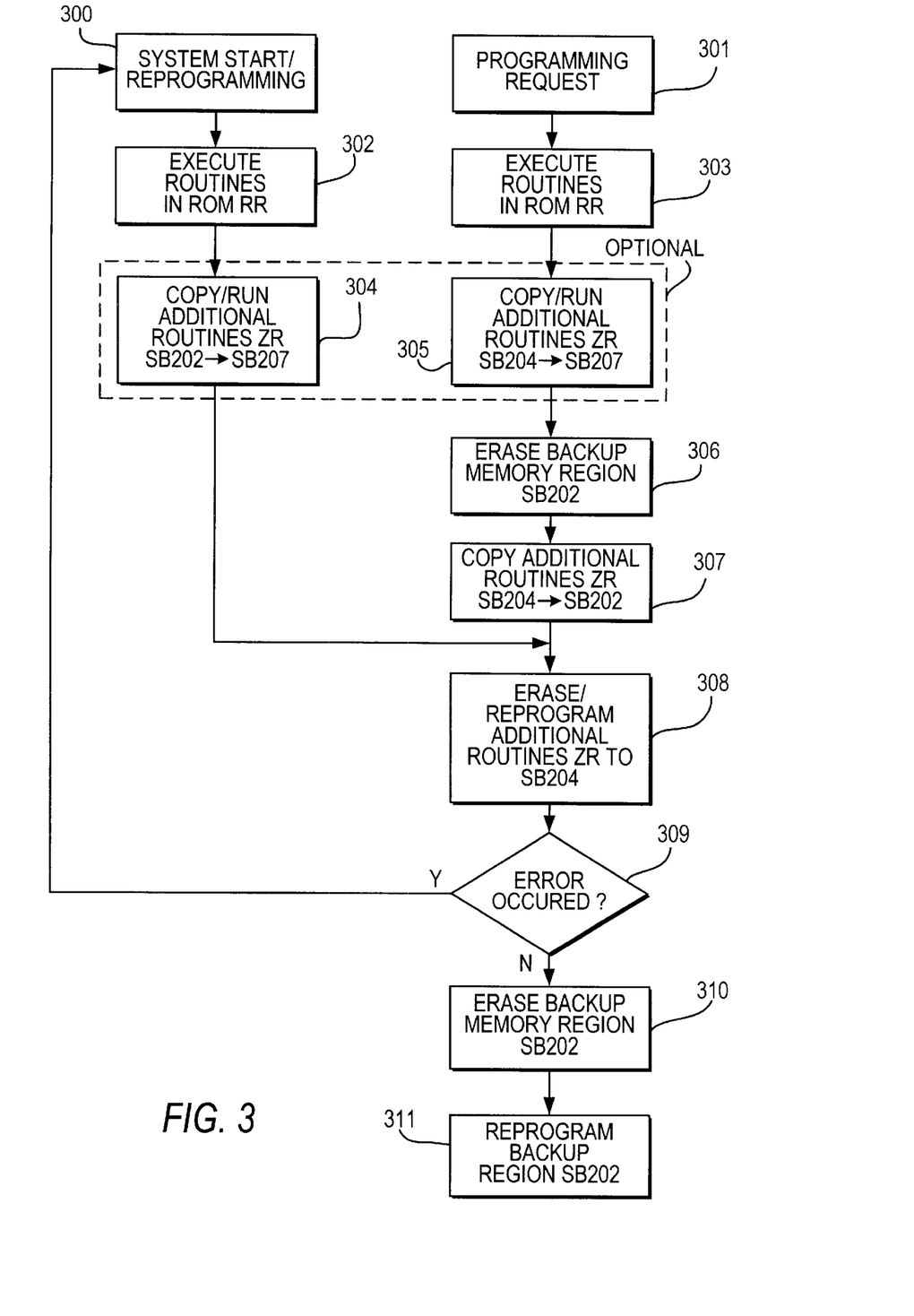
FIG. 3 is a flow chart for a first embodiment of the method of backing up the second or additional routines according to the invention.

A first embodiment for backing up the additional routines ZR using the ROM memory is shown in FIG. 3. According to whether a system start or new programming or a simple program request, the method begins with the step shown in block 300 or with the step shown in block 301. The routines in ROM RR in the step shown in block 303 are executed according to this program request when a program request is made in the step shown in block 301. The routines in ROM RR activate or prompt the copying of the additional routines ZR in the step shown in block 305 from the memory region SB 204 into the memory region SB 207 in RAM. These additional routines ZR for example are a program for specific individual Flash EPROM programming. The additional routines ZR are subsequently executed in RAM memory region SB 207 and automatically control additional copying, erasing and/or programming processes for the flash memory 104. Alternatively the additional routines ZR control the additional copying, erasing and/or programming with the help of program routines from ROM RR. In other words, the additional routines ZR and the ROM routines RR can optionally cooperate with each other. This control of additional copying, erasing and/or programming process for the flash memory can however occur independently under control of the routines in ROM RR (SB 209). The data and/or programs or program routines in the memory region SB 202, the backup region for the additional routines ZR, are next erased in the step shown in block 306 and replaced by a reliable copy of the additional routines ZR in the step shown in block 307 of the flow chart. Thus the additional routines ZR are copied from the memory region SB 204 to the backup region, the memory region SB 202.

Now an erasure and subsequent reprogramming of the memory region SB 204 with a completely new version of the additional routines ZR can occur from the outside in the step shown in block 308, for example from the external programming unit 108 via the input/output interface 107. Also in the step shown in block 308 optionally additional parts of the flash memory (e.g. memory regions of the programming routines) are erased and/or programmed.

After that, whether or not an error occurred in the memory region 204 during the programming of the additional routines in the step shown in block 308, is tested in the step shown in block 309. If no error occurred, now the additional routines in the memory region SB 202 can be deleted or erased in the step shown in block 310 after the end of the programming, and either they can be replaced from the outside by the originally present data and/or program routines or by changed or new versions of these data and/or programming routines. This occurs in the step shown in block 311. In case of an error, if also an error occurs according to the step in block 309, i.e. after interruption of programming for various reasons when no valid data and/or program routines are found during programming, this is detected by the routines in ROM RR in the step shown in block 300 and they initiate a system restart or reprogramming in the step shown in block 302. The routines in ROM RR active or prompt copying of the backup copies of the additional routines ZR from the memory region 202 into the memory region 207 in RAM. Optionally the additional routines together with the ROM routines RR can be executed together. Moreover activated programming of the memory region SB 204 can occur from the outside as originally provided. After finishing programming the additional routines ZR in memory region SB202 are discarded and are either replaced (block 311) by the originally present data and/or programming routines or a changed new version of this data and/or programming routines. This means that the backup copy of the additional routines ZR does not remain permanently stored, but is erased after successful programming and the data and/or programs in this memory region can be overwritten with other changed data and/or programs. Other parts of the flash memory can be optionally erased and/or programmed in the step shown in block 311.

Figure 4:
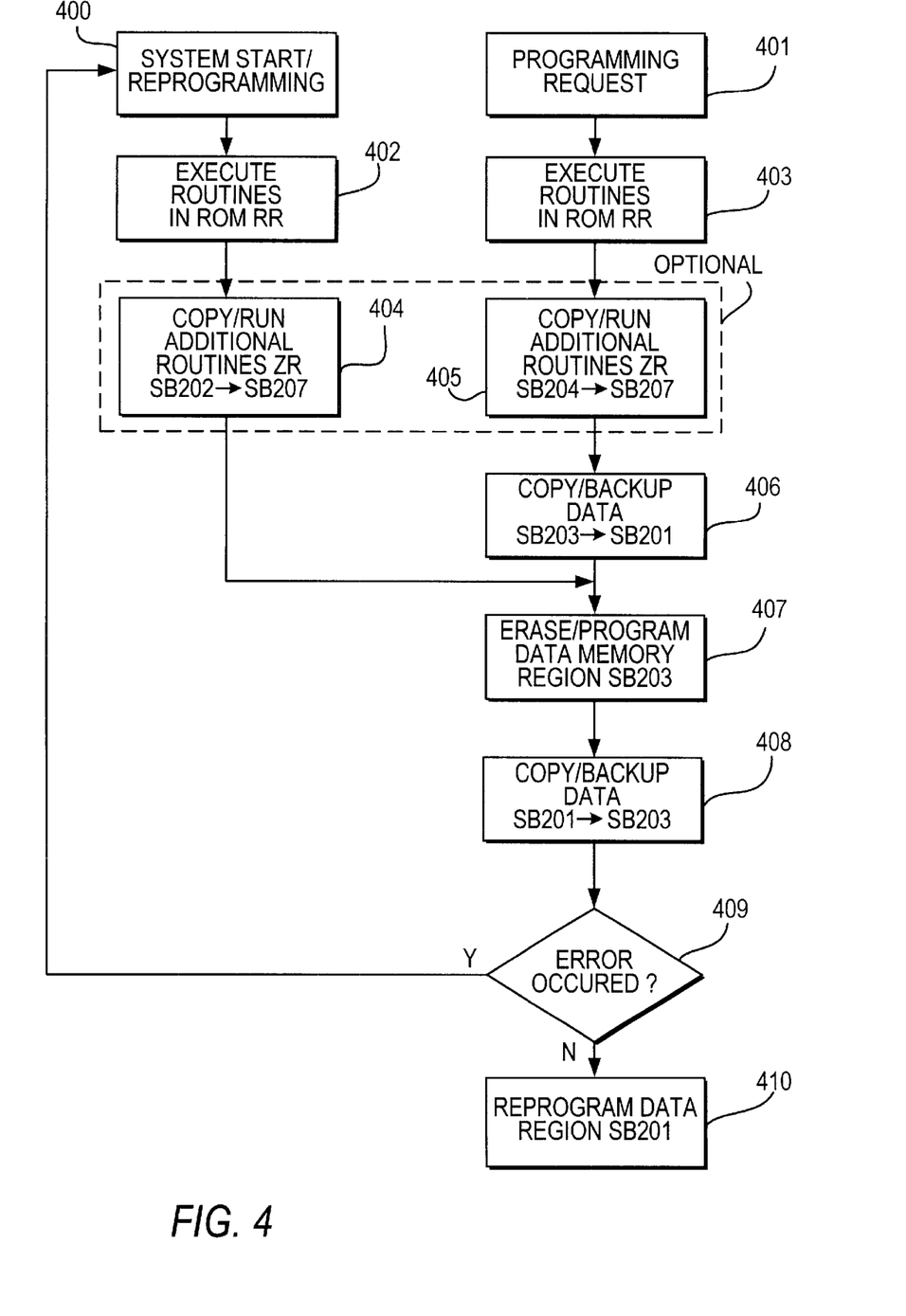
FIG. 4 is a flow chart for a first embodiment of the method of backing up data which can be backed up according to the invention.

A method for backing up data with the memory region division described in FIG. 2 arrangement is shown in FIG. 4 that is comparable to the above-described embodiment of the method for the additional routines. The data SD to be backed up are for example data that must never be lost during the lifetime of the control unit. It is also possible however that this data may be expanded or increased during the lifetime of the control unit. That is taken into account by the embodiment of the method shown in FIG. 4. The process or method starts at the system start or reprogramming in the step shown in block 400 or at a program request in the step shown in block 401. When data SD must be backed up at a program request, the appropriate routines in ROM RR are executed in the step shown in block 403 by the program request in the step shown in block 401. Also the routines in ROM RR prompt the copying of the additional routines ZR for flash programming from the memory region SB 204 in flash memory into the memory region SB 207 of RAM. The additional routines ZR in RAM memory region 207 are subsequently executed and automatically control the further copying, erasing and/or programming for the flash memory 104 with or without the help of the programming routines from the ROM RR. In other words, the additional routines ZR and the ROM routines RR can optionally cooperate. Alternatively further coping, erasing and/or programming can take place independently under control of the routines in ROM RR (SB 209). For the case in which the data region or memory region SB 203 in which the data is found must be erased during programming these data SD are backed up in memory region SB 201. This occurs in the step shown in block 406. Now the data region SB 203 is erased and reprogrammed in the step shown in block 407. The data SD to be backed up from the memory region SB 201 are again copied into the original data region, memory region SB 203 in the step shown in block 408. This process is under control of the additional routines ZR copied into the memory region SB 204 in RAM and/or of the routines in ROM RR (see description in regard to FIG. 3). The stored data is tested for correctness in the decision block 309 as in the previous method for program routines. In case of error, also after an interruption of the programming for various reasons, during which no valid data is found in memory region SB 203, the routines in ROM RR initiate a new start or reprogramming of the system in the step shown in block 400 which takes place in the step shown in block 402. The error testing here occurs with the state of the art methods. The routines RR and/or ZR prompt or activate copying of the backup copies of the data to be backed up rom the memory region SB 201 into the original memory region, memory region SB 203. Moreover the additional routines ZR are loaded from the flash memory region SB 204 into the RAM SB 207 in the step shown in block 404. Control of the process in blocks 407, 408 and 410 as well as 409 occurs by means of the routines in ROM RR and/or the additional routines ZR. If no error occurs in the back up of the data SD to be backed up, the data region SB 201 can for example be reprogrammed from outside by means for the external input device 108. However internal data can also be used in this situation.

In this exemplary embodiment additional portions of the flash memory may be optionally erased and/or programmed in the steps shown in blocks 308 and/or 311 and/or 407 and/or 410.

In a second embodiment of the method the use of the ROM can be eliminated from the method of automatically restoring a non-volatile, non-changeable memory to a definite initial state described in the first embodiment. The method can occur without the ROM but is based on the presence of a boot block. This boot block however is either located in CPU 101 or in a region of the flash memory 104 that is inaccessible to the user or write protected. For that reason the symbolic division of the memory as shown in FIG. 5 does not include the ROM.

Figure 5:
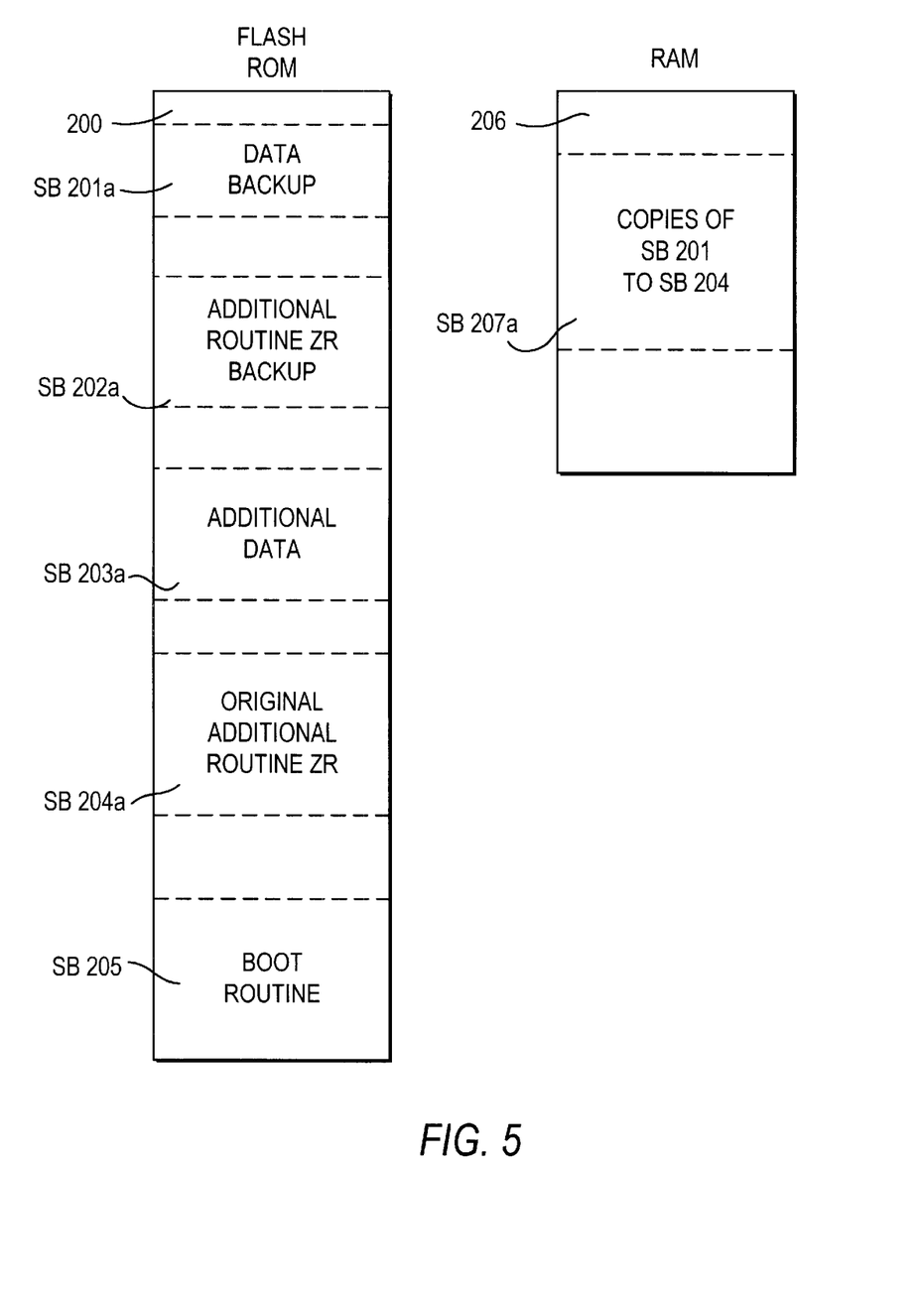
FIG. 5 is a diagrammatic view showing a second embodiment of a division of memory into a flash and RAM memory.

In the embodiment shown in FIG. 5 the flash memory 104 symbolically is represented by the block 200. The comparable memory regions SB 201a to SB 204a are defined as in the previous embodiment. The boot block or boot routine RB is located in the memory region 205. The routines RR localized in ROM are now divided into a part in flash memory, the flash routines RF, and a part required in the boot block. The block 206 again represents the RAM memory 105. In this embodiment the memory region SB 207a receives the flash routines RF and/or the additional routines ZR, which perform the process control from the RAM. The memory region SB 207a used in RAM can differ in size or position from the comparable memory region SB 207 shown in FIG. 2. The same goes for the memory regions SB 201a to SB 204a of the block 200 representing the flash memory 104. Also these memory regions can differ in their size and position for the comparable memory regions shown in FIG. 2. The memory region 201a is again a region for backup of data. The memory region 202a is a region for back up of the additional routines ZR and the flash routines RF, which were previously part of the ROM routines RR. The memory region SB 203a is the original region for the data in this embodiment. The memory region SB 204a is similarly the original region for the routines. As already mentioned the additional routines ZR and parts of the routines previously in the ROM routines RR are assembled together in the backup region 202a because the use of the ROM has been eliminated. The remaining parts of the routines stored previously in ROM are stored in the boot lock in memory region SB 205 and are designated as boot block routines RB.

Figure 6:
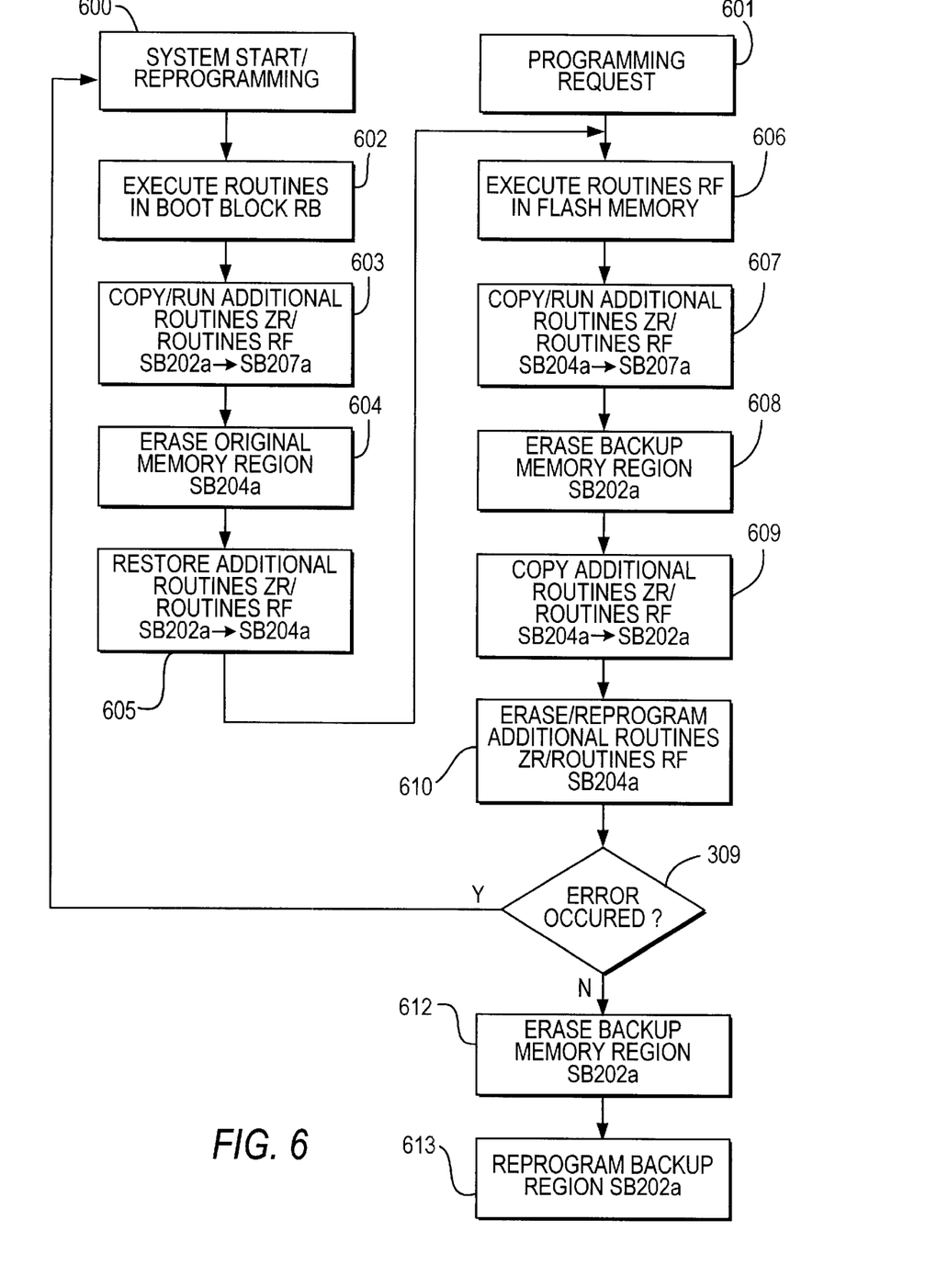
FIG. 6 is a flow chart for a second embodiment of the method of backing up programs and additional routines according to the invention.

In FIG. 6 the flow chart for the second embodiment of the method shows that the flash routines RF in flash memory are executed in the step shown in block 606 after a program request in the step shown in block 601. The flash routines RF in flash memory prompt copying of the additional routines ZR and parts of the previously used earlier ROM routines RR from memory region 204a into memory region 207a of RAM. This occurs in the step shown in block 607. The parts of the routines in ROM RR from the previously described embodiments, which are located now in flash memory outside of the boot block (boot routines RB) are designated as flash routines RF. Since these flash routines in flash memory must quasi-copy themselves, a somewhat different embodiment of the method is described in the following.

The first possibility would be that the flash routines RF in flash memory are not completely transferred into the RAM memory so that also the part of the flash routines RF, which is responsible for copying the remaining part of the flash routines RF and the additional routines ZR, remains in flash memory region, especially in memory region SB 204a.

An additional approach is to provide special routines in the part of the flash routines RF which is copied into memory region SB 207a in the RAM memory which copy the remaining part of the flash routines RF in flash memory which is responsible for copying the rest of the routines RF and the additional routines ZR into the RAM memory in the next step. The entire contents of the memory region SB 204a would be copiable into the RAM memory in this variation of the method. These routines for subsequent copying of the routines remaining in the flash memory can be part of the flash routines RF and/or the additional routines ZR so that the process can be controlled by the additional routines ZR and/or the flash routines RF already transferred into the RAM.

Besides those procedures another possibility exists because of the division of the routines into the flash routines RF and the additional routines ZR. Because of that division, if the additional routines ZR are to be copied into the RAM memory region SB207a from the memory region SB 204a, the flash routines RF are automatically copied from the flash memory into the RAM memory by the RAM. Thus the entire copying process would take place in a single step and would be controlled from the start by the flash routines RF and thus the responsibility for control would be transferred to it.

The routines (ZR and/or RF) copied into the RAM memory are subsequently executed there and control the additional copying, erasing and programming processes for flash memory. The additional control of the following processes can occur by either the additional routines ZR and/or the flash routines RF.

For reprogramming the data and/or programs in memory region 202a (backup region) are next erased in the step shown in the step shown in block 608. In the step shown in the step shown in block 609 a backup copy of the additional routines ZR and/or the flash routines RF is written into the memory region SB 202a from the memory region 204a. Erasing and programming of the memory region 204a with an entirely new version of the additional routines ZR and/or the flash routines RF can take place now from the outside. This is performed in the step shown in the step shown in block 610. The correctness of the programming process is now tested in the step shown in the step shown in block 309 by the test already mentioned in connection with the previous embodiment. If the programming has been performed correctly, the entire backup region SB 202a is discarded or erased in the step shown in the step shown in block 612 and/or replaced either by the original data and/or programs present or a new version of this data and/or programs from the outside in the step shown in the step shown in block 613. These are rewritten then into the memory region 202a. Optionally other parts of the flash memory are erased or reprogrammed in the steps shown in blocks 610 and/or 613.

In the case of an error (block 309), i.e. after interruption of the programming for a variety of reasons, whether no valid data and/or programs are found in the memory region SB204a, is determined by the routines in the boot block RB after the system start in the step shown in block 602 or reprogramming in the step shown in block 600. The boot block routines prompt copying of the backup copy of the flash routines RF and/or the additional routines ZR from the memory region 202a into the memory region 207a of RAM. The routines in RAM, the additional routines ZR and/or flash routines RF in memory region 207a now independently control an immediate rewrite of the routines ZR and/or RF. The original memory region, memory region SB204a, is erased in the step shown in block 604. By writing the additional routines ZR and/or the flash routines RF into the memory region 204a from the memory region 202a this original memory region is restored. After that an arbitrary programming process can be requested without conflict with the backup copies in the memory region 202a. In case of an error the control device continually reprograms the concerned region, but all data to be backed up is found at the beginning of this reprogramming again in its originally assigned region. Thus a definite initial state is automatically reproduced.

Figure 7:
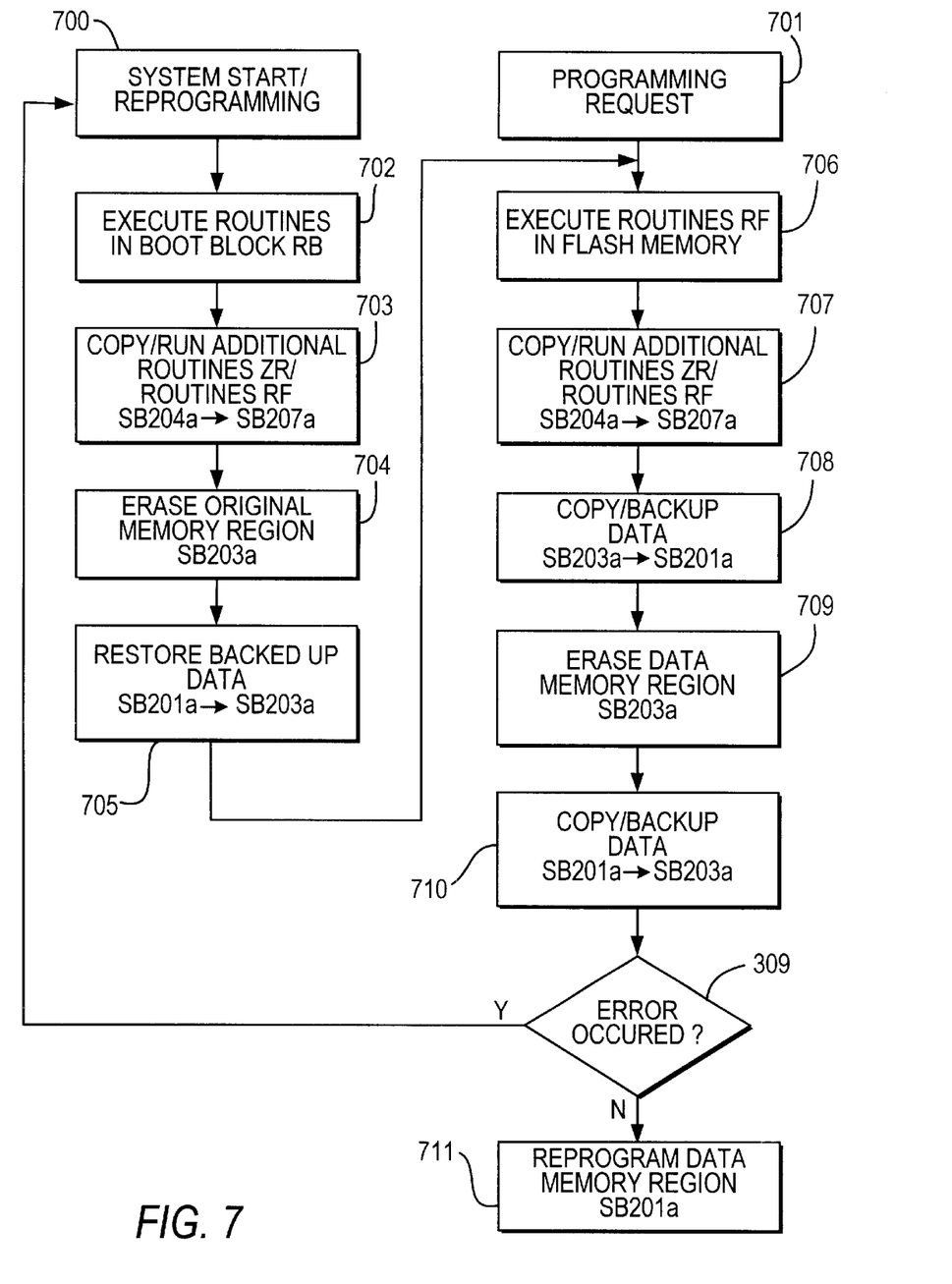
FIG. 7 is a flow chart for a second embodiment of the method of backing up data according to the invention.

In FIG. 7 the embodiment of the method for backup of the data SD to be backed up without the use of the ROM is shown. Again starting with a programming request in the step shown in block 701 the flash routines RF are executed in the step shown in block 706. They prompt the copying of the additional routines and/or the flash routines RF and/or part of the flash routines RF, for example similarly by means of the method described in connection with FIG. 6, from the memory region 204a into the memory region 207a of RAM. The routines are subsequently executed and control the additional copying, erasing and/or programming processes for the flash memory. For example, for the case in which the region in which the data SD to be backed up is found must be entirely or partially erased in the programming process, these data are copied from the memory region 203a into the memory region 201a and thus backed up. This occurs in the step shown in block 708. In step shown in block 709 at least the data region SB203a is completely or partially erased and in block 710 the data SD to be backed up are copied into the memory region SB203a from the memory region SB201a. Again whether an error in the programming process has occurred is tested in the decision block 309 as in the previous examples and embodiments. When no error has occurred, the memory region 201a can be reprogrammed by replacing its contents with the originally present data and/or programs or a new version of these data and/or programs from the outside. Optionally additional parts of the flash memory can be erased and reprogrammed in the steps shown in blocks 709 and/or 711.

In the case of an error during which no valid data is found in the memory region 203a after interruption of the programming for various reasons, this is established or determined after or by system start and reprogramming in the step shown in block 700 by the routines in the boot block RB in the step shown in block 702. The routines prompt the copying of the backup copy of the data SD to be backed up from the region 201a into the original memory region SB203a. The routines in boot block RB activate the copying of the additional routines ZR and/or the flash routines RF and/or parts of these flash routines RF, for example by means of the method described in connection with FIG. 5, from the memory region 204a into the memory region 207a of RAM in the step shown in block 703. The routines are subsequently executed and control the additional copying, erasing and programming processes for the flash memory. Moreover the original region for the data, memory region 203a, is erased in the step shown in block 704 and the data SD to be backed up are copied from the backup region into the original region and thus the original memory region 203a is restored to its original state. After that an arbitrary programming process can be requested or commanded from the outside, for example in the step shown in block 701, without conflicting with the backup copy in region SB201a. In case of error the control device continually requests reprogramming of the concerned region, but all data SD to be backed up are found in the originally assigned memory region at the beginning of this reprogramming process. Thus a definite initial state in regard to the data SD to be backed up can be reproduced in the same way as for the routines in the example shown in FIG. 6. In the case of an error the originally started process is freshly initialized and the data SD to be backed up is automatically restored. The backup copy of the data SD to be restored is immediately rewritten after erasure of the original, so that it is not written over what remains of the original.

In this embodiment additional parts of the flash memory can be optionally erased and/or reprogrammed in the steps shown in blocks 610 and/or 613 and/or 709 and/or 711. The entire contents of the flash memory, with the exception of the region or regions in which the data SD to be backed up and/or the routines to be backed up are stored, may be reprogrammed.

For all embodiments the backup copies of the data SD to be backed up are rewritten into the original memory region in which that data was stored immediately after the erasure of the original region. Similarly the backup copies of the routines to be backed up are erased after the successful programming (tested in block 309) and then the data found there and/or arbitarily new data and/or programs are input. The disclosure in German Patent Application 198 39 680.5-53 of Sep. 1, 1998 is incorporated here by reference.

This German Patent Application describes the invention described hereinabove and claimed in the claims appended hereinbelow and provides the basis for a claim of priority for the instant invention under 35 U.S.C. §119.

While the invention has been illustrated and described as embodied in method and device for changing memory contents in a control unit, especially of a motor vehicle, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims.

We claim:

1. A method of changing and/or inputting data and/or programs into at least one first memory (104, 200) of a computer system (100), the computer system including an input/output interface, said method comprising the steps of:
    a) dividing the programs into at least one first routine (RR, RB, RF) and at least one second routine (ZR);
    b) by providing at least one second memory (105,206);
    c) dividing said at least one first memory (104, 200) into a plurality of memory regions (SB201 to SB204; SB207);
    d) backing up said at least one second routine (ZR) by copying said at least one second routine (ZR) to said at least one second memory;
    e) erasing (306) a portion of said memory regions;
    f) copying (307) said at least one second routine (ZR) to said portion of said memory regions previously erased; and
    g) erasing (308) the memory region of the at least one first memory that stores said at least one second routine and reprogramming (308) with data read in from said input/output interface, whereby a backup copy of said second routine is provided in at least one of said at least one first memory and said at least one second memory.

2. The method as defined in claim 1 wherein said at least one first routine loads and calls said at least one second routine and said at least one first routine and said at least one second routine perform the copying and erasing and reading in.

3. The method as defined in claim 1, wherein a backup copy of said data is provided in at least one of said at least one first memory and at least one said second memory, and wherein said backup copy of said data is again input as an original copy of said data after the erasing or copying or reading in.

4. The method as defined in claim 1, wherein said backup copy of said at least one second routine is erased after the erasing and copying and reading in if no error occurs.

5. The method as defined in claim 3, wherein the erasing and copying and reading in are automatically recovered when an error occurs in said erasing or copying or reading in.

6. The method as defined in claim 1, wherein the erasing and copying and reading in are automatically recovered when an error occurs in said erasing or copying or reading in and an originally started process of changing and/or inputting of the at least one second routine is initialized anew in said at least one first memory of said computer system.

7. The method as defined in claim 1, wherein said at least one first routine is located in a first non-volatile memory or is input or copies into said first non-volatile memory.

8. The method as defined in claim 1, wherein said at least one second memory is a volatile or non-volatile intermediate memory in which the at least one second routine is stored.

9. The method as defined in claim 8, wherein said memory regions obtained by said dividing of said at least one first memory include an original memory region, a backup memory region and/or a buffer memory region.

10. The method as defined in claim 9, further comprising controlling said erasing and copying and reading in by program portions and data portions first input into said volatile or non-volatile intermediate memory.

11. The method as defined in claim 10, further comprising erasing said backup memory region in order to perform said backing up of said at least one second routine by said copying and said reading in and storing additional data and other routines in said back up memory region.

12. The method as defined in claim 1, wherein said at least one first routine or at least a part of said at least one first routine for starting respective process steps of said copying and said erasing and said reading in are stored in a non-volatile memory device or a non-volatile memory region.

13. The method as defined in claim 1, wherein said routines and said data comprise means for controlling operations in a motor vehicle.

14. A computer system for changing and/or inputting data and/or programs into at least one fist memory (104, 200) of a computer system (100), said computer system comprising:

means for dividing the programs into at least one first routine (RR, RB, RF) and at least one second routine (ZR);

means for providing at least one second memory )105, 206);

means for dividing said at least one first memory (104, 200) into a plurality of memory regions (SB201 to SB204; SB207);

means for backing up said at least one second routine (ZR) by copying said at least one second or additional routine (ZR) to said at least one second memory;

means for erasing (306) a portion of said memory regions;

means for copying (307) said at least one second routine (ZR) to said portion of said memory regions previously erased; and means for erasing (308) the memory region of the at least one first memory that stores said at least one second routine and reprogramming (308) with data read in from said input/output interface, whereby a backup copy of said second routines is provided in at least one of said at least one first memory and said at least one second memory.

15. The computer system as defined in claim 14, wherein said at least one first memory is a non-volatile memory and said at least one second memory is a volatile or non-volatile memory.

16. The computer system as defined in claim 14, wherein said at least one second memory is an intermediate memory in which said at least one second routine is temporarily stored.

17. The computer system as defined in claim 14, wherein said at least one first memory is divided into an original memory region, a backup memory region and/or an intermediate memory region.

18. The computer system as defined in claim 14, including means for controlling operations in a motor vehicle.

\* \* \* \* \*